US008798206B2

(12) United States Patent
Ilie et al.

(10) Patent No.: US 8,798,206 B2
(45) Date of Patent: Aug. 5, 2014

(54) VITAL DIGITAL INPUT

(75) Inventors: Gabriel Cristian Ilie, Richmond Hill (CA); Virgil Lostun, Thornhill (CA); Daniel Sandu, Toronto (CA); Ovidiu Stan, Newmarket (CA)

(73) Assignee: Thales Canada Inc., Toronto, Ontario (CA)

( * ) Notice: Subject to any disclaimer, the term of this patent is extended or adjusted under 35 U.S.C. 154(b) by 379 days.

(21) Appl. No.: 13/347,741

(22) Filed: Jan. 11, 2012

(65) Prior Publication Data

US 2013/0177307 A1 Jul. 11, 2013

(51) Int. Cl.
*H04L 27/06* (2006.01)
*H03K 19/003* (2006.01)
*H03K 17/16* (2006.01)

(52) U.S. Cl.
USPC .................... 375/340; 326/9; 326/26; 398/17

(58) Field of Classification Search
USPC ........ 326/9, 13, 37–47, 101; 375/340; 398/17
See application file for complete search history.

(56) References Cited

U.S. PATENT DOCUMENTS 4,611,291 A 9/1986 Hoelscher
4,908,552 A * 3/1990 Kumakura ................. 315/241 P
5,626,619 A * 5/1997 Jacobson et al. .................. 607/5
5,684,679 A * 11/1997 Hong ......................... 363/21.01
5,818,681 A * 10/1998 Futsuhara et al. ............ 361/179
2010/0031942 A1* 2/2010 Lepley .......................... 123/605
2011/0121210 A1* 5/2011 Oono et al. ................... 250/551

OTHER PUBLICATIONS

David Rutherfort, A Vital Digital Control System With a Calculable Probability of an Unsafe Failure, Proceedings of the Fifth Annual Conference on Computer Assurance, 1990 Section the Vital Input Circuit and Fig. 3 on pp. 3-4.

* cited by examiner

*Primary Examiner* — Thienvu Tran

(74) *Attorney, Agent, or Firm* — Marks & Clerk; S. Mark Budd

(57) ABSTRACT

A digital input interface is provided which can be checked for its reliability. The configuration of the circuit on the input side allows a high impedance for a DC input signal and a low impedance for induced AC noise, naturally attenuating any AC induced noise while maintaining the DC input signal. The interface also provides a latent failure detection engine. The latent failure detection engine can open and close an opto-coupler on the input side of the interface, which discharges and charges a capacitor on the input side. The time taken for the capacitor to recharge when the optocoupler is re-opened is used to determine if there has been any threshold decay in the interface.

9 Claims, 5 Drawing Sheets

VITAL DIGITAL INPUT

FIELD OF THE INVENTION

The invention relates to digital input circuits, and more particularly to circuits with high immunity to induced AC noise in the input signal.

BACKGROUND OF THE INVENTION

In a digital input interface a DC signal from a remote unit arrives over a signal line. The voltage of the DC signal is used to determine whether a digital. "1" or a "0" is to be sent to other subsystems. At its most basic, a Zener diode can be used in series with a resistor and a current detector. If the DC voltage is high enough that it exceeds the breakdown voltage of the Zener diode then a current flows through the circuit, and the current detector indicates that the DC signal is active. If the DC voltage is lower than the breakdown voltage of the Zener diode then no current flows through the circuit, and the lack of current induces the current detector to indicate that the DC signal is inactive.

For example, rail systems usually have a control system for managing trains. The control system receives state information from remote field elements. Some remote field elements provide this information to the control system by setting the DC voltage on a wire leading to the control system. At the control system the voltage on the wire is used to establish the state of the device to which the respective field element is assigned.

As a simple example, a railroad track circuit is given. To manage train traffic, the track is divided in segments called blocks. When a block is occupied by a train, the track circuit detects the presence of the train and signals to the control systems using a DC voltage. At the control system, the voltage on the wire is detected and used to transmit to subsystems a digital indication of the block occupancy. A diagram of such a system is shown in FIG. 1. The track circuits are always constructed in such way that it will signal "low" or 0V if a train is detected and "high" or 24V (for example) if the block is not occupied. The "high" or active state is called "permissive" in this context because in this state the trains are permitted to enter the block. Opposite, the "low" state is called "restrictive" because trains are restricted from entering the track block.

The signaling method based on permissive/restricted concept described for the track circuit is also applied for other system elements such as train and platform doors, rail switches, trip stop mechanisms, etc. In general, the permissive state is always associated with electrical elements/circuits being in an energized state. With this signaling arrangement, failures such as interrupted wires or bad circuit contacts will always result in "low" signals. In such case traffic will be restricted (stopped) and therefore the possible failure will always result in a safe state.

A digital input interface is termed "vital" if 100% certainty is needed in asserting the "permissive" or "1" or "high" state, and by corollary it must be known if the interface is faulty in such a way that the fault may indicate a "permissive" ("1") state when the input signal signals in fact a "restrictive" ("0"). Digital input interfaces for rail control systems are often vital. In the example given above, it is crucial that the subsystems correctly know the unoccupied state of the block. An incorrect reading resulting from an unknowingly faulty interface can have disastrous consequences, such as allowing another train to enter the block when the control subsystem erroneously interprets an input signal as "permissive" when in fact the input signal is meant to be read as "restrictive". It is however acceptable from a safety perspective that the digital input interface may fail in such a way that it will indicate a state of "restrictive" when in fact the field element indicates "permissive". This type of failure is still undesirable because it will cause trains to stop unnecessarily with consequences in delays and revenue, but at least no accidents will happen.

One cause of error is induced noise. Nearby electrical wires can induce an AC signal in the DC signal sent from the remote field element to the interface. For example, the signal line from a field element to the control system in railroad, systems usually lies along a railroad track. Due the distance between the field element and the control system, which is often at a central location, there is a good chance that the signal line will pass near other electrical wires. The induced AC noise can bring the received voltage above the threshold in a periodic manner. This, in conjunction with the read-by-sampling of the input processor can result in an assignment of a "1" as if a valid DC signal were received. An example of this is illustrated in FIG. 2.

Another cause of error is the decay of the threshold to which the DC voltage is compared in order to determine of the input signal corresponds to a "1" or a "0". This can occur as the characteristics of circuit components change with age or temperature. Manufacturing issues, environmental conditions, or electrical surges may also produce failure in circuits and components. For example, the breakdown voltage of a Zener diode may gradually change with time, or alternatively the reverse leakage current can increase. This can exacerbate the effects of noise, as following such events low magnitude noise may falsely trigger the input circuit into the "high" state.

Yet another possible cause of error is the asymmetry of the input circuit. Common mode noises may be transformed into differential mode noises, contributing to false triggering of the input circuit into the "high" state.

An interface which minimized the effect of noise would contribute to the vitality of the interface, as would periodic test for detection of threshold decay and noise attenuation capability.

SUMMARY OF THE INVENTION

In accordance with one aspect of the invention, a digital input interface circuit is provided. The digital input interface has a line carrying an input signal, and a first optocoupler, a first resistor, and a second resistor, connected in series on the line. A capacitor is connected in parallel with the first optocoupler and connected in series with the first resistor and with the second resistor. A Zener diode and at least one additional optocoupler are connected in series, the Zener diode and the at least one additional optocoupler being connected in parallel with the capacitor, being connected in parallel with the first optocoupler, and being connected in series with the first resistor and with the second resistor. Each additional optocoupler has a corresponding input processor configured to receive electrical signals from a receiving side of the optocoupler. A Latent Failure Detection (LFD) engine is configured to receive signals from the least one input processor and is configured to send signals to open and close the first optocoupler, whereby in response to commands from one of the at least one input processor the LID engine is able to send signals to the first optocoupler causing the first optocoupler to close for a predetermined duration and then open. Each input processor is configured to determine a response time of the capacitor from signals received from the corresponding additional optocoupler. Each input processor is configured to determine that the digital input interface is unreliable if the input processor determines that the response time of the capacitor falls outside a predetermined range.

In accordance with another aspect of the invention, a method of determining the reliability of a digital input interface is provided. A first optocoupler on the interface is closed for a predetermined duration, causing current to bypass at least one additional optocoupler. After the predetermined duration the first optocoupler is opened, causing the capacitor to charge and after a period of time causing current to flow through the additional at least one optocoupler because of breakdown of a Zener diode when the capacitor is sufficiently charged. For each additional optocoupler, a response time is determined as the difference in time between opening of the first optocoupler and an indication by the additional optocoupler that current is flowing therethrough. If any determined response time is outside a predetermined range of an expected response time, then it is determining that the digital input interface is unreliable.

In accordance with yet another aspect of the invention, a digital input interface circuit is provided. The digital input interface has a line carrying an input signal, a first optocoupler connected in series on the line, a capacitor connected in parallel with the first optocoupler, at least one voltage threshold circuit, at least one input processor, each input processor corresponding to one of the at least one voltage threshold circuit, and a Latent Failure Detection (LFD) engine configured to send signals to open and close the first optocoupler. Each input processor is configured to determine a response time of the capacitor from signals received from the corresponding voltage threshold circuit. Each input processor is configured to determine that the digital input interface is unreliable if the input processor determines that the response time of the capacitor falls outside a predetermined range.

The interface of the present invention allows a high impedance for the DC input signal and a low impedance for induced AC noise. Since non-intended AC coupling implies a high source impedance, any AC induced noise will be naturally attenuated. The interface also provides a latent failure detection engine which can be used to periodically check for threshold decay by determining the charging time of a capacitor in the signal side of the interface. An added advantage is that the circuit forms a natural filter blocking higher frequency signals, and therefore the sampling frequency can be lower without risking the aliasing effects illustrated in FIG. 2.

BRIEF DESCRIPTION OF THE DRAWINGS

The features and advantages of the invention will become more apparent from the following detailed description of the preferred embodiment(s) with reference to the attached figures, wherein.

It will be noted that in the attached figures, like features bear similar labels.

DETAILED DESCRIPTION OF THE EMBODIMENTS

Figure 1:
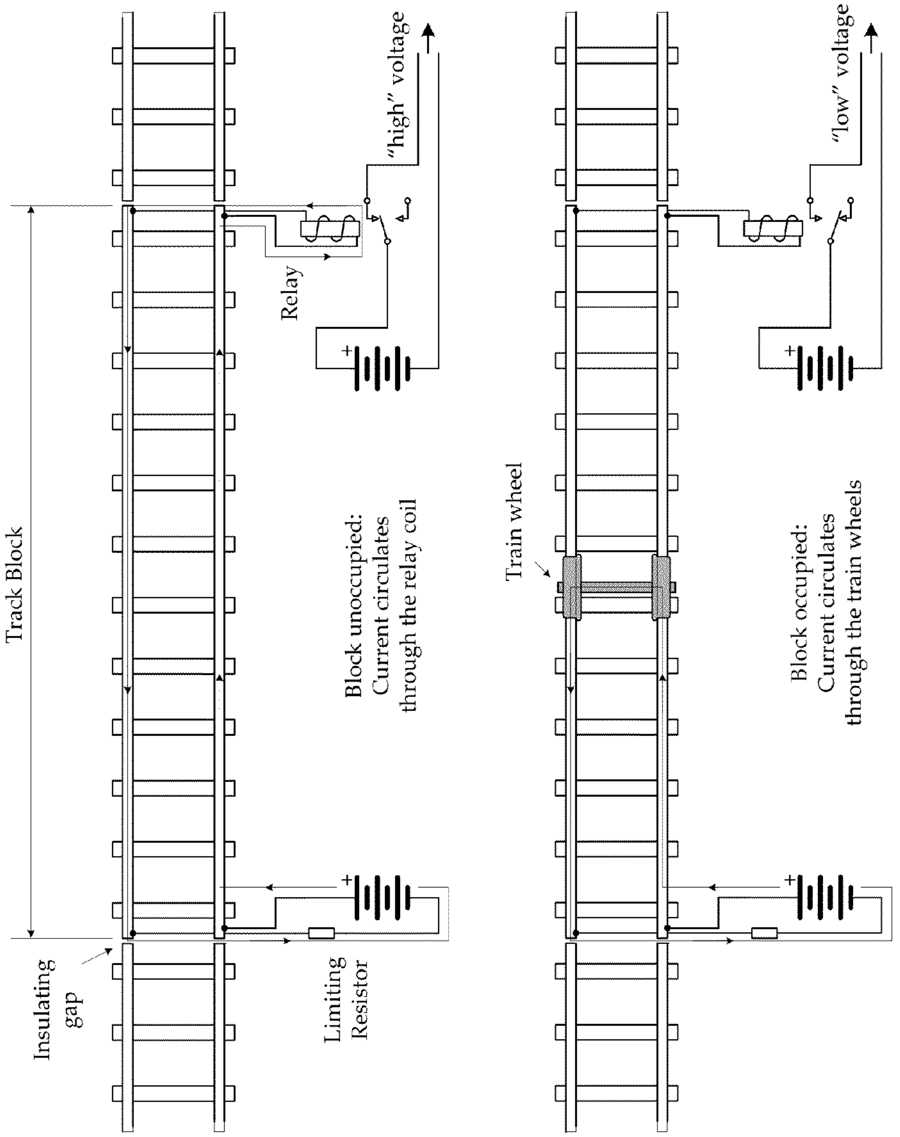
FIG. 1 is a diagram of an example field element.
Figure 2:
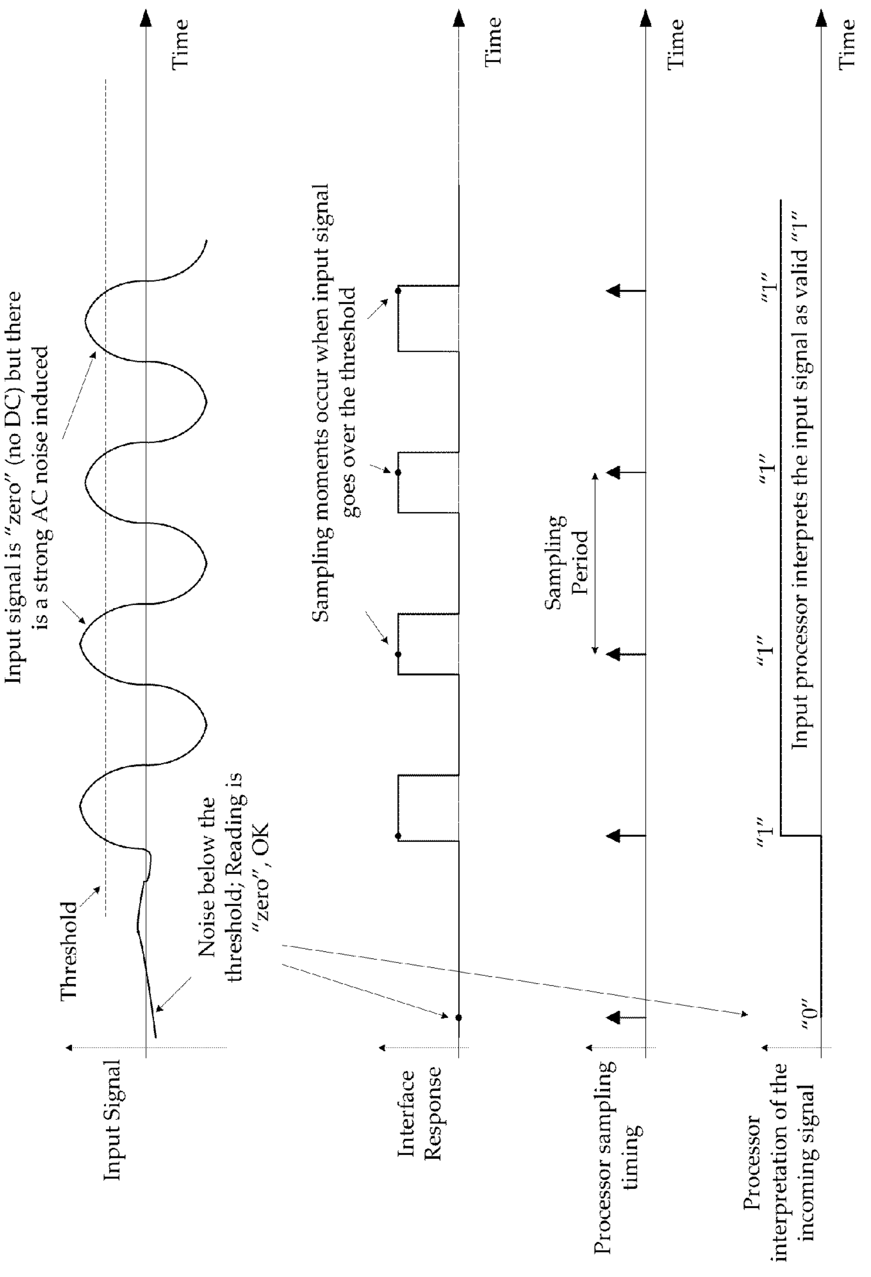
FIG. 2 is a timing diagram showing an aliasing effect.
Figure 3:
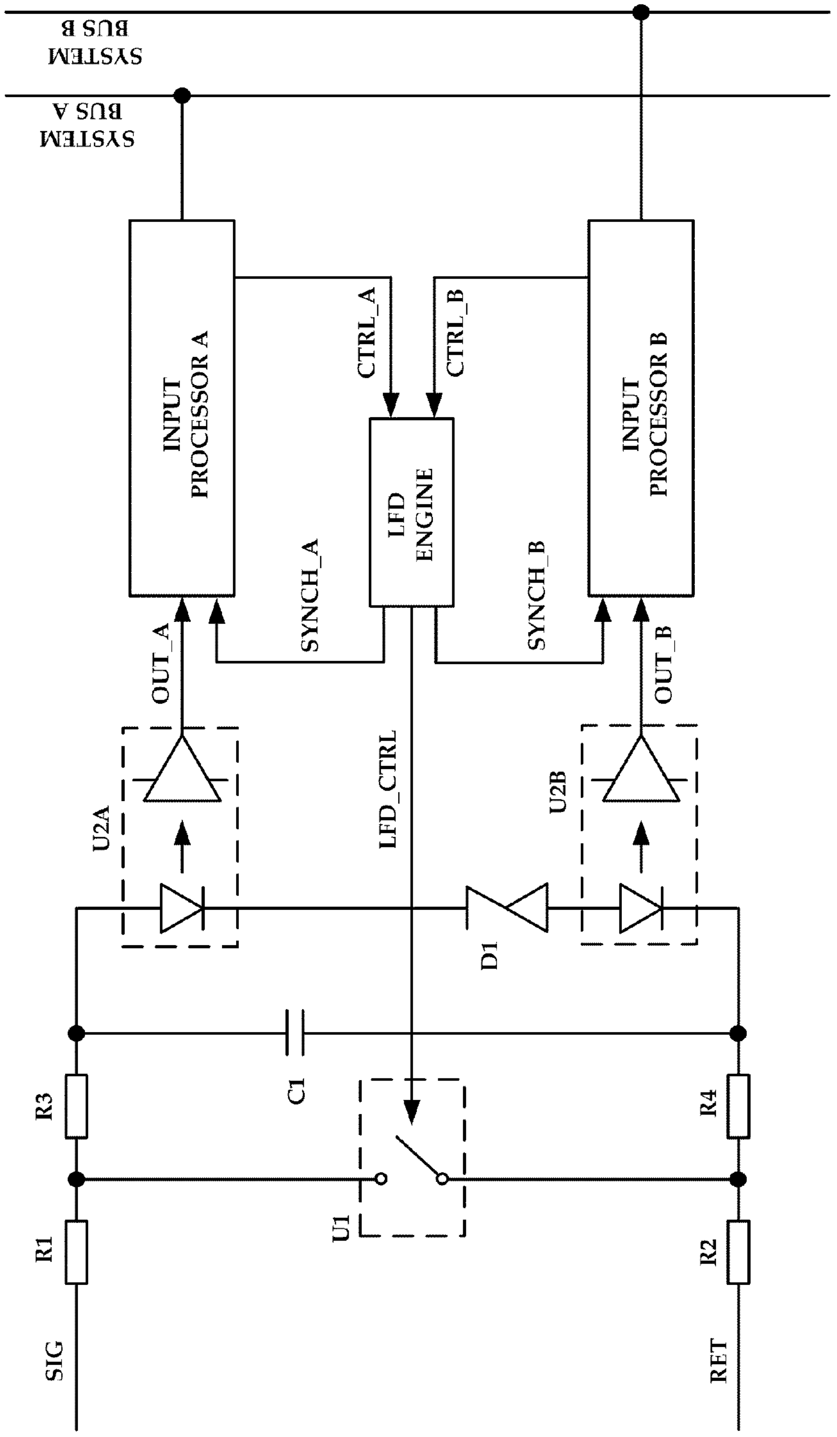
FIG. 3 is a circuit diagram of a digital input interface according to one embodiment of the invention.

Referring to FIG. 3, a circuit diagram of a digital input interface according to one embodiment of the invention is shown. The interface comprises an input side connected to a remote field element (the left side of FIG. 3) and an output side connected to a control system (the right side of FIG. 3). On the input side, the line carrying the signal SIG contains in series a first resistor R1, a first optocoupler U1, and a second resistor R2. In parallel with the first optocoupler U1 are a third resistor R3, a non-polarized capacitor C1, and a fourth resistor R4, all in series. In parallel with the capacitor C1 are a second optocoupler U2A, a zener diode D1, and a third optocoupler U2B, all in series.

The first optocoupler U1 acts like an open-closed switch, as explained below, and hence is shown as a switch in FIG. 3. The emitting side of the first optocoupler U1 (that coming from the output side) is an LFD. Examples of suitable implementations of the receiving side of the first optocoupler U1 (that is, on the input side of the interface) are a phototransistor bipolar, a phototransistor bipolar Darlington, and a phototransistor MOS.

The second and third optocouplers U2A and U2B have LEDs on the input side. Examples of suitable implementations of the photodetector on the receiving side (that is, on the output side of the interface) are a photodiode, a phototransistor bipolar, a phototransistor bipolar Darlington, and a phototransistor MOS.

On the output side the photodetector within the second optocoupler U2A is triggered by photons from the LFD of the second optocoupler U2A and produces electrical signals, the second optocoupler U2A having a first activation level. The second optocoupler U2A is coupled to and feeds electrical signals OUT_A to a first input processor A. The first input processor A is coupled to a first system bus. The first input processor A is also coupled to and can send control signals to a Latent Failure Detection (LFD) engine. The LFD engine can send LFD control signals to the first optocoupler U1. The LFD engine is also coupled to and can send synchronization signals to the first input processor A. Collectively, the first input processor A and the first system bus are termed herein as the first output subsystem.

The photodetector within the third optocoupler U2B is triggered by photons from the LFD of the second optocoupler U2B and produces electrical signals, the third optocoupler U2B having a second activation level. The third optocoupler U2B is coupled to and feeds electrical signals OUT_B to a second input processor B. The second input processor B is coupled to a second system bus. The second input processor B is also coupled to and can send control signals to the LFD engine. The LFD engine is also coupled to and can send synchronization signals to the second input processor B. Collectively, the second input processor B and the second system bus are termed herein as the second output subsystem. The second output subsystem is a duplication of the first output subsystem.

The use of the optocouplers U1, U2A, and U2B electrically isolates the input side of the interface from the output side of the interface. This protects the processors on the output side against field impairments such as electrical surges and inductions.

In operation, the first optocoupler U1 is normally left open. The voltage of the signal SIG produces a current which charges the capacitor C1 and attempts to pass through the zener diode D1. If SIG is of a high voltage then the capacitor C1 will quickly charge, and the breakdown voltage of the Zener diode D1 is set so that the high voltage of SIG causes current to flow through the LEDs of the optocouplers U2A and U2B. The LEDs then produce photons which reach the photodetectors of the optocouplers U2A and U2B and, assuming the activation levels of the photodetectors is exceeded, signals are sent to the respective input processor. The input processors indicate to the respective system bus that a high binary state has been indicated by SIG.

If the signal SIG is of a low voltage then the breakdown voltage of the Zener diode is not reached, no or very little current passes through the LEDs of the optocouplers U2A and U2B, the photodetectors of the optocouplers U2A and U2B are not triggered, no or very low power signals are sent to the respective input processor, and the input processors indicate to the respective system bus that a low binary state has been indicated by the signal SIG.

The capacitor C1 in series with the resistors acts to filter high frequencies in the signal SIG. This lowpass filter blocks out high frequency components of any AC noise in the signal SIG. The lowpass filter also prevents any high frequencies which could otherwise lead to aliasing, which allows a lower sampling frequency of the signal SIG to be used.

Figure 4:
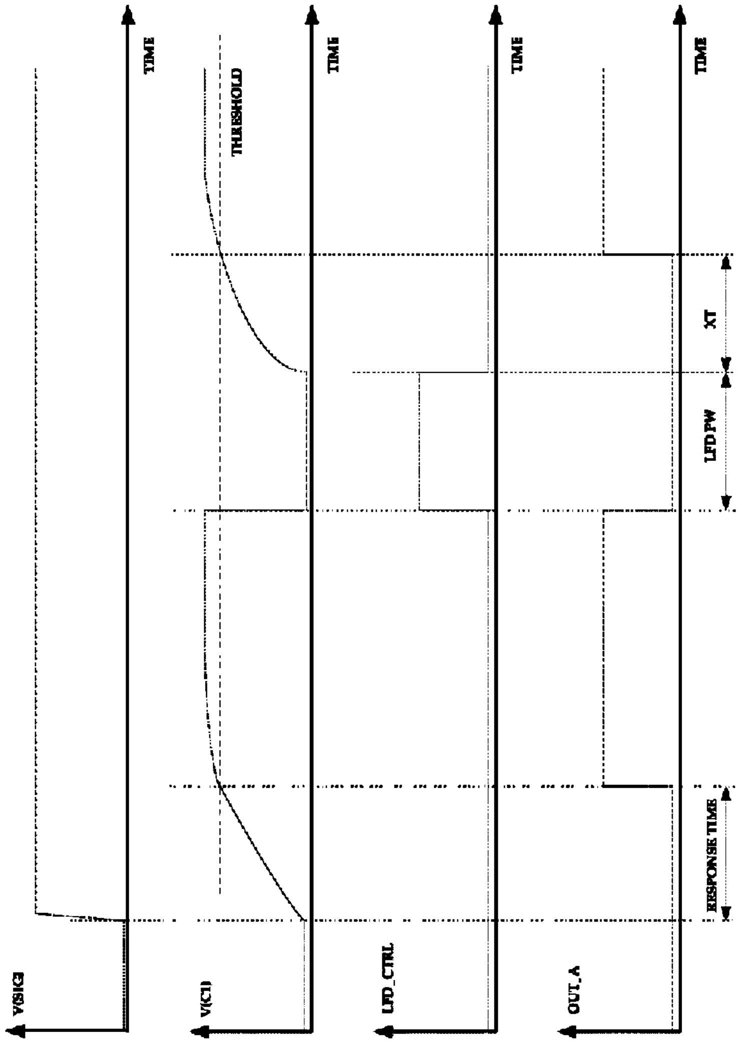
FIG. 4 is a timing diagram showing the relationship between LFD pulse width and capacitor response in the circuit of FIG. 3 according to one embodiment of the invention.

Periodically the system is tested for threshold decay. This is done by closing and opening the first optocoupler U1. When this is done, the capacitor C1 recharges and there is some delay before the voltage across the Zener diode D1 reaches the breakdown voltage, at which point the photodiodes of the optocouplers U2A and U2B are triggered. Referring to FIG. 4, a timing diagram showing the relationship between LFD pulse width and capacitor response in the circuit of FIG. 3 according to one embodiment of the invention is shown. The periodic testing is performed when the voltage of the input signal V(SIG) is high. During a particular test the voltage of the input signal V(SIG) may be low, or may start low and switch to high mid-test, but in either case that particular test is simply ignored.

The capacitor C1 has a response time for the voltage across the capacitor V(C1) to reach a threshold. At this point, since the first optocoupler U1 is left open, the breakdown voltage of the Zener diode D1 is reached and the photodiode of the second optocoupler U2A is triggered, and the first input processor A receives a high output value OUT_A. The photodiode of the third optocoupler U2B is also triggered, causing the second input processor B to also read a high output value OUT_B, but this is not shown in FIG. 4.

The first input processor A then sends a CTRL signal to the LFD Engine. In response thereto, the LFD Engine sends a synchronization signal to each input processor, and then sends an LFD_CTRL signal of duration LFD_PW. The LFD_CTRL signal causes the first optocoupler U1 to close. The input signal SIG travels through the resistors R1, R2, and the closed optocoupler U1, and the capacitor C1 discharges. The drop in V(C1) causes the voltage across the Zener diode D1 to fall below the breakdown voltage. The first input processor A and the second input processor B receive low output values OUT_A and OUT_B since current bypasses the second and third optocouplers U2A and U2B and there insufficient current therethrough to trigger output of photons.

After the duration LFD_PW, the LFD Engine stops sending the LFD_CTRL signal and the first optocoupler U1 opens. The charge on the capacitor C1 increases, and after a duration XT the voltage across the capacitor V(C1) again exceeds the threshold necessary to trigger the photodiodes in the optocouplers U2A and U2B, and the first input processor A and the second input processor B receive high output values OUT_A and OUT_B.

It should be noted that only one of the two input processors send a CTRL signal to the LFD Engine to trigger a LFD_CTRL signal. However both input processors determine the value of XT, which is a measure of the response time of the capacitor C1. As stated above, after receiving a CTRL signal from either input processor, the LFD Engine sends a synchronization signal to each input processor. Upon receiving a synchronization signal from the LFD Engine, each input processor enters a WAIT mode. When an input processor enters a WAIT mode it expects to acquire two events: OUT_A (or OUT_B) falling from "1" to "0", followed by OUT_A (or OUT_B) rising from "0" to "1". Each input processor has the capability to measure the time elapsed between these two events. The length of LFD_PW is known to each input processor, and the measured value of XT can be determined by subtracting the known duration of LFD_PW from the total time measured between the two events.

In one embodiment, analysis of the two values of XT determined by the input processors is done by the input processors themselves. The input processors each send its respective measured value of XT to the other input processor using a protocol over a local link (not shown in FIG. 3). Each input processor compares the received value of XT with its own measured value of XT. If either input processor determines that the two measured values of XT are not identical (or close within acceptable tolerance) then that input processor reports the health of the input circuit as "FAILED", i.e. the digital input interface is unreliable.

If the input processors determine that the two measured values of XT are identical (or close within acceptable tolerance) then the interface is itself evaluated by comparing the measured value of XT with an expected value of XT. The effects of threshold decay can be seen by considering FIG. 4. As the threshold above which a "1" is determined lowers, the time at which V(C1) crosses the threshold following re-opening of the first optocoupler shortens. Some deviation from the expected value of XT is expected, for example due to allowed variance in the voltage of an "on" signal SIG. However, if an input processor determines that the measured value of XT is outside a predetermined acceptable range of the expected value of XT, then the threshold has decayed and the input processor reports the health of the input circuit as "FAILED".

In an alternative embodiment, analysis of the two values of XT determined by the input processors is done at a higher system level (not shown in FIG. 3). The input processors each send its respective measured value of XT over the respective system bus to the next higher system. The higher system compares the received measured values of XT. If the higher system determines that the two measured values of XT are not identical (or close within acceptable tolerance) then the higher system evaluates the health of the input circuit as "FAILED". If the higher system determines that the two measured values of XT are identical (or close within acceptable tolerance) then the interface is itself evaluated by comparing the measured value of XT with an expected value of XT. If the higher system determines that the measured value of XT is less than the expected value of XT, then the threshold has decayed and the higher system evaluates the health of the input circuit as "FAILED".

In either embodiment, the input circuit is deemed to be good only if the measured values of XT are the same and if the measured value of XT is close to the expected value of XT.

The value of XT is determined by both input processors in order to provide the level of trust required by the vital concept. In other words, two processors measuring the same parameter should produce the same, or practically the same, result. A simultaneous failure in both input processors in such a way that both would measure XT with significant and identical error is extremely unlikely.

The interface disclosed provides additional advantages in reducing induced noise. The input interface consists of a symmetrical circuit (R1, R2, R3, R4, and C1). The non-symmetrical components (the Zener diode D1 and the LEDs of the optocouplers U2A and U2B) are behind the symmetrical structure. This arrangement offers maximum common mode noise immunity.

Induced AC noise is also reduced by selecting the values of R1, R2, and the capacitance of C1 so as to increase impedance at low frequencies and decrease impedance at high frequencies. The signal perceived at the input of a circuit is, ignoring the normal signal source in the circuit, the noise magnitude $V_N$ reduced by a factor of input impedance divided by the sum of input impedance $Z_{IN}$ and noise impedance $Z_N$:

$$V_{IN}=V_N*(Z_{IN}/(Z_{IN}+Z_N)).$$

It is therefore desirable for an input circuit to have a low input impedance at frequencies at which AC inductions may occur. However, in order to minimize the useful DC signal attenuation and power dissipation and to ensure a reasonable response time, it is desirable for the circuit to have a rather high impedance at very low frequencies, including DC.

Figure 5:
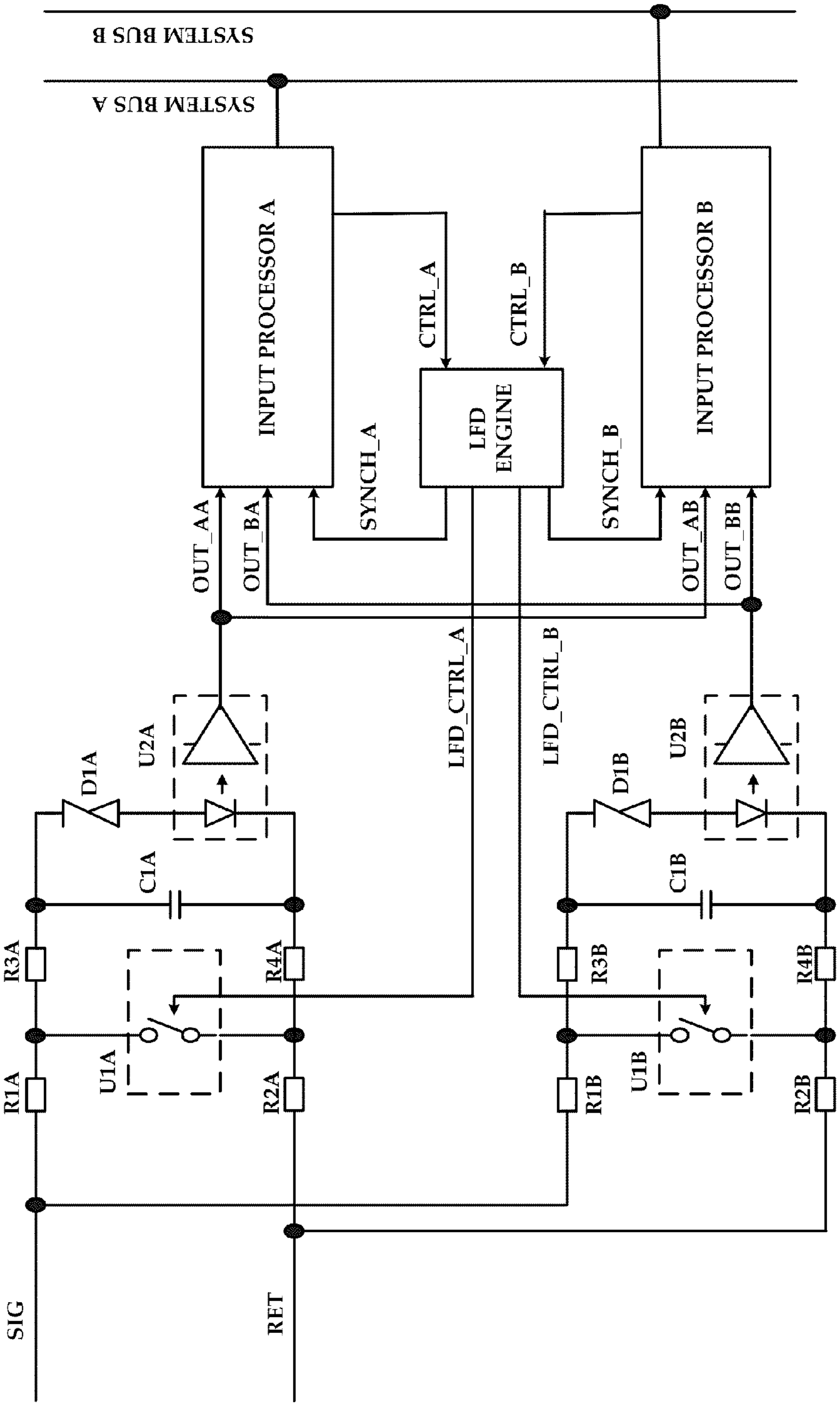
FIG. 5 is a circuit diagram of a digital input interface according to another embodiment of the invention.

Referring to FIG. 5, an alternative in which there are two input circuit interfaces is shown. Each input circuit interface is identical, and is similar to that shown in FIG. 3 except each input circuit interface has only one optocoupler producing signals. Each input processor measures the value of XT of each output optocoupler. This circuit arrangement allows variations of XT due to normal conditions such as input voltage variations and temperature to be better distinguished from variations of XT due to failure or circuit degradation.

The embodiments described above measure XT by sending a single pulse LFD_CTRL from the LFD Engine to the first optocoupler U1. Alternatively, the LFD Engine sends a succession of pulses of various durations. This allows better precision in evaluating XT.

The embodiments described above have an LFD Engine as a device separate from the input processors. Alternatively, the LFD Engine can be implemented within the same devices as the input processor.

The functionality of the LFD Engine and the input processors described above are preferably carried out by circuitry within integrated chips. Alternatively, any form of hardware could be used to carry out the functionality of the LFD Engine and the input processors, as could software or any combination of hardware and software. If carried out in whole or in part by software, the software can be stored as instructions on a non-transitory computer-readable storage medium.

The invention has been described using a Zener diode and optocouplers U2A and U2B as voltage threshold circuits for detecting if an input voltage exceeds a threshold. Alternatively, any other embodiment of one or more voltage threshold circuits may be used, such as a comparator. Two or more voltage threshold circuits may share one or more components, such as the Zener diode in the embodiment described above.

The embodiments presented are exemplary only and persons skilled in the art would appreciate that variations to the embodiments described above may be made without departing from the spirit of the invention.

We claim:

1. A digital input interface circuit comprising:

a line carrying an input signal;

a first optocoupler, a first resistor, and a second resistor, connected in series on the line;

a capacitor connected in parallel with the first optocoupler and connected in series with the first resistor and with the second resistor;

a Zener diode and at least one additional optocoupler connected in series, the Zener diode and the at least one additional optocoupler being connected in parallel with the capacitor, being connected in parallel with the first optocoupler, and being connected in series with the first resistor and with the second resistor;

for each additional optocoupler, a corresponding input processor configured to receive electrical signals from a receiving side of the additional optocoupler; and a Latent Failure Detection (LFD) engine configured to receive signals from the at least one input processor and configured to send signals to open and close the first optocoupler, whereby in response to commands from one of the at least one input processor the LFD engine is able to send signals to the first optocoupler causing the first optocoupler to close for a predetermined duration and then open;

wherein each of the at least one input processor is configured to determine a response time of the capacitor from signals received from the corresponding additional optocoupler, and wherein each of the at least one input processor is configured to determine that the digital input interface is unreliable if the input processor determines that the response time of the capacitor falls outside a predetermined range.

2. The digital input interface circuit of claim 1 wherein each input processor is configured to determine the response time of the capacitor by:

receiving a signal at a first time from the corresponding additional optocoupler that the input signal is in a low state;

subsequently receiving a signal at a second time from the corresponding additional optocoupler that the input signal is in a high state; and determining the response time of the capacitor from the difference between the first time and the second time.

3. The digital input interface circuit of claim 1 wherein the LFD engine is implemented on each of at least one device, each device having implemented thereon one of the at least one input processors.

4. The digital input interface circuit of claim 1 wherein the number of additional optocouplers is two.

5. The digital input interface circuit of claim 4 wherein the digital input interface is symmetric other than the directional nature of the electrical properties of the Zener diode.

6. A method of determining the reliability of a digital input interface, comprising:

closing a first optocoupler on the digital input interface for a predetermined duration, causing current to bypass at least one additional optocoupler;

after the predetermined duration opening the first optocoupler, causing a capacitor to charge and after a period of time causing current to flow through the additional at least one optocoupler because of breakdown of a Zener diode when the capacitor is sufficiently charged;

for each of the at least one additional optocoupler, determining a response time as the difference in time between opening of the first optocoupler and an indication by the additional optocoupler that current is flowing therethrough; and determining that the digital input interface is unreliable if any determined response time is outside a predetermined range of an expected response time.

7. The method of claim 6 wherein the number of additional optocouplers is two, and wherein the method further comprises determining that the digital input interface is unreliable if the two determined response times differ by more than an accepted tolerance.

8. A digital input interface circuit comprising:

a line carrying an input signal;

a first optocoupler connected in series on the line;

a capacitor connected in parallel with the first optocoupler;

at least one voltage threshold circuit;

at least one input processor, each input processor corresponding to one of the at least one voltage threshold circuit; and a Latent Failure Detection (LFD) engine configured to send signals to open and close the first optocoupler;

wherein each of the at least one input processor is configured to determine a response time of the capacitor from signals received from the corresponding voltage threshold circuit, and wherein each of the at least one input processor is configured to determine that the digital input interface is unreliable if the input processor determines that the response time of the capacitor falls outside a predetermined range.

9. The digital input interface circuit of claim 8, wherein each input processor is configured to determine the response time of the capacitor as the difference in time between the time that the LFD engine opens the first optocoupler after closing the first optocoupler and the time that the corresponding voltage threshold circuit indicates that the input signal is in a high state.

* * * * *